US011532056B2

(12) United States Patent
Pi et al.

(10) Patent No.: US 11,532,056 B2
(45) Date of Patent: Dec. 20, 2022

(54) DEEP CONVOLUTIONAL NEURAL NETWORK BASED ANOMALY DETECTION FOR TRANSACTIVE ENERGY SYSTEMS

(71) Applicant: Siemens Aktiengesellschaft, Munich (DE)

(72) Inventors: Jiaxing Pi, Weehawken, NJ (US); Phan Minh Nguyen, Stanford, CA (US); Sindhu Suresh, Monroe Township, NJ (US)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 488 days.

(21) Appl. No.: 16/638,568

(22) PCT Filed: Jun. 19, 2018

(86) PCT No.: PCT/US2018/038152
§ 371 (c)(1),
(2) Date: Feb. 12, 2020

(87) PCT Pub. No.: WO2019/036095
PCT Pub. Date: Feb. 21, 2019

(65) Prior Publication Data
US 2020/0218973 A1 Jul. 9, 2020

Related U.S. Application Data

(60) Provisional application No. 62/546,730, filed on Aug. 17, 2017.

(51) Int. Cl.
G06E 1/00 (2006.01)
G06E 3/00 (2006.01)
(Continued)

(52) U.S. Cl.
CPC ......... *G06Q 50/06* (2013.01); *G01R 21/1333* (2013.01); *G01W 1/02* (2013.01);
(Continued)

(58) Field of Classification Search
USPC ................................... 706/6, 20, 21, 25, 44
See application file for complete search history.

(56) References Cited

PUBLICATIONS

Improved convolutional neural network-based quantile regression for regional photovoltaic generation probabilistic forecast, IET The institution of Engineering and Technology, Yu et al., 2020.*

(Continued)

Primary Examiner — Brian Ngo

(57) ABSTRACT

A computer-implemented method for power grid anomaly detection using a convolutional neural network (CNN) trained to detect anomalies in electricity demand data and electricity supply data includes receiving (i) electricity demand data comprising time series measurements of consumption of electricity by a plurality of consumers, and (ii) electricity supply data comprising time series measurements of availability of electricity by one or more producers. An input matrix is generated that comprises the electricity demand data and the electricity supply data. The CNN is applied to the input matrix to yield a probability of anomaly in the electricity demand data and the electricity supply data. If the probability of anomaly is above a threshold value, an alert message is generated for one or more system operators.

20 Claims, 8 Drawing Sheets

(51) Int. Cl.

| | |
|---|---|
| *G06Q 50/06* | (2012.01) |
| *G06F 16/2458* | (2019.01) |
| *H02J 13/00* | (2006.01) |
| *H02J 3/00* | (2006.01) |
| *G01R 21/133* | (2006.01) |
| *G01W 1/02* | (2006.01) |
| *G06N 3/04* | (2006.01) |
| *G06N 3/08* | (2006.01) |
| *G06Q 30/02* | (2012.01) |
| *H02J 3/38* | (2006.01) |

(52) U.S. Cl.
CPC ........... *G06F 16/2474* (2019.01); *G06N 3/04* (2013.01); *G06N 3/08* (2013.01); *G06Q 30/0205* (2013.01); *H02J 3/0012* (2020.01); *H02J 13/00002* (2020.01); *H02J 13/00034* (2020.01); *H02J 3/381* (2013.01); *H02J 2300/22* (2020.01); *H02J 2300/28* (2020.01)

(56) References Cited

PUBLICATIONS

Tadanobu, Inoue et al: "Deep reinforcement learning for high precision assembly tasks"; 2017 IEEE/RSJ International Conference on Intelligent Robots and Systems (IROS), IEEE; Sep. 24, 2017 (Sep. 24, 2017), pp. 819-825, XP033266016.
International Search Report dated Aug. 9, 2018; International Application No. PCT/US2018/038152; 14 pages.
Dong Xishuang et al: 11 A CNN based bagging learning approach to short-term load forecasting in smart grid, 2017 IEEE Smartworld, Ubiquitous Intelligence & Computing, Advanced & Trusted Computed, Scalable Computing & Communications, Cloud & Big Data Computing, Internet of People and Smart City Innovation.
Amarasinghe Kasun et al: "Deep neural networks for energy load forecasting", 2017 IEEE 26th International Symposium on Industrial Electronics (ISIE), IEEE, Jun. 19, 2017 (Jun. 19, 2017), pp. 1483-1488 / Jun. 19, 2017.
Hosein Stefan et al: "Load forecasting using deep neural networks", 2017 IEEE Power & Energy Society Innovative Smart Grid Technologies Conference (ISGT), IEEE, Apr. 23, 2017 (Apr. 23, 2017), pp. 1-5 / Apr. 23, 2017.

* cited by examiner

DEEP CONVOLUTIONAL NEURAL NETWORK BASED ANOMALY DETECTION FOR TRANSACTIVE ENERGY SYSTEMS

CROSS-REFERENCE TO RELATED APPLICATIONS

This application claims the benefit of U.S. Provisional Application Ser. No. 62/546,730 filed Aug. 17, 2017, which is incorporated herein by reference in its entirety.

FIELD OF THE INVENTION

The invention relates generally to an anomaly detection system for transactive energy systems that utilizes a deep convolutional neural network.

BACKGROUND

With the advent of microgrids and newer Smart Grid technologies in recent years, there has been a significant change in the way power system is operated. The increased use of flexible distributed energy resources has led to the need to address the economics and control system implications to ensure grid reliability. This has resulted in a new framework for power system operation and control called Transactive Energy. Transactive Energy (TE) refers to the use of a combination of economic and control techniques to improve grid reliability and efficiency. This framework demands an extensive information exchange among demand response resources, local generation sources, storage devices, grid monitoring and control devices, and microgrids. It also requires information exchange among markets, utility operations, customers, and service providers. These information exchanges happen through communication channels, such as the public Internet. This puts the TE System (TES) under potential cyber intrusions and attacks.

Typically, data collected in the TES are interrelated. For example, decreasing demand will have negative impact on the price in the energy market and the output of the power generators; meanwhile, increasing the bidding price will reduce the demand but increase the output from power generation stations. Therefore, simply monitoring data from different sources independently might avoid attacks that violate the interrelation between them. Moreover, to understand the physical relationship between different data sources and thus construct useful features for the anomaly detection purpose requires domain expert and assumption-based modeling. This process is not generic and thus cannot be applied to a different system and configuring such a model for a unique system could be time consuming and expensive.

Most of the anomaly detection methods related to TES are directly migrated from the Information Technology (IT) world. They are useful if the attacks are only targeting the cyber layer of the TES. However IT solutions fail to address attacks where the cyber layer is breached and the attackers gain access to and are able to manipulate the physical level information. Several recent studies proposed anomaly detection methods based on physical layer information and most of them are designed for a certain component or subsystem of smart grids, such as substation, or smart meters. Those previous methods might suffer from several major issues when monitoring the TES.

First, subsystems or components within a TES are dynamically linked to each other and changes in one subsystem might lead to the fluctuation in another system. Monitoring a single subsystem may lack the ability to discover the inconsistency between different subsystems. For example, if a power generator doesn't change its output according to the electricity price in the market, an anomaly detection model learned solely from the data from the generator may fail to detect the scenario.

Second, to implement an anomaly detection method requires a set of finely designed features and requires domain expert to construct the physical mode which is expensive and time consuming. Also, the feature constructed for one subsystem might be only useful for another system with the same configuration and environment, which is rarely the case. The difficulties of building such a physical model may even increase if we incorporate the interaction between different subsystems.

SUMMARY

Embodiments of the present invention address and overcome one or more of the above shortcomings and drawbacks, by providing methods, systems, and apparatuses related to an anomaly detection system for TES that utilizes a deep convolutional neural network.

According to some embodiments, a computer-implemented method for power grid anomaly detection using a convolutional neural network (CNN) trained to detect anomalies in electricity demand data and electricity supply data includes receiving (i) electricity demand data comprising time series measurements of consumption of electricity by consumers, and (ii) electricity supply data comprising time series measurements of availability of electricity by one or more producers. An input matrix is generated that comprises the electricity demand data and the electricity supply data. Other data may also be included in the input matrix such as time series records of transactive exchanges between the producers and the consumers for energy purchases, time series pricing data corresponding to pricing of electricity from the producers, weather data indicating weather conditions at locations corresponding to the producers or consumers. The CNN is applied to the input matrix to yield a probability of anomaly in the electricity demand data and the electricity supply data. If the probability of anomaly is above a threshold value, an alert message is generated for one or more system operators. In one embodiment, the CNN is retrained using feedback provided by the system operators in response to the alert message.

According to other embodiments, a computer-implemented method for power grid anomaly detection using a CNN to detect anomalies in electricity demand data includes receiving (i) electricity demand data comprising time series measurements of consumption of electricity by consumers and (ii) pricing data indicating price of power for delivery to the geographical area at times corresponding to the time series measurements of the electricity demand data. A subset of the electricity demand data corresponding to a subset of the consumers located within a geographic area is selected. Then, an input matrix is generated comprising the subset of electricity demand data and the pricing data. The CNN is applied to the input matrix to yield an indication of an anomaly in the electricity demand data. An alert message is generated for system operators based on the indication of an anomaly.

According to other embodiments, a system for using a CNN trained to detect anomalies in electricity demand data comprises smart meters and a parallel processing platform. The smart meters collect electricity demand data comprising time series measurements of consumption of electricity by consumers. The parallel processing platform includes a host computer configured to (i) receive electricity supply data comprising time series measurements related to the availability of electricity by one or more producers, and (ii) generate an input matrix comprising the electricity demand data and the electricity supply data. Additionally, the parallel processing platform includes a device computer comprising processors configured to apply the CNN to the input matrix to yield a probability of anomaly in the electricity demand data and the electricity supply data.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there are shown in the drawings embodiments that are presently preferred, it being understood, however, that the invention is not limited to the specific instrumentalities disclosed. Included in the drawings are the following Figures.

DETAILED DESCRIPTION

Systems, methods, and apparatuses are described herein which relate generally to a deep convolutional neural network (CNN) based anomaly detection framework that monitors multiple data sources from different subsystems in the TES, such as bidding prices and demand from the energy market, load from the substations, weather information from the sensors, etc. A CNN model can be constructed for a particular component or general TE infrastructure based on the purposes of cyber security tasks. Because CNN can extract the high level features combining multiple data sources, this approach can be easily applied to TES with different configurations and components.

Figure 1:
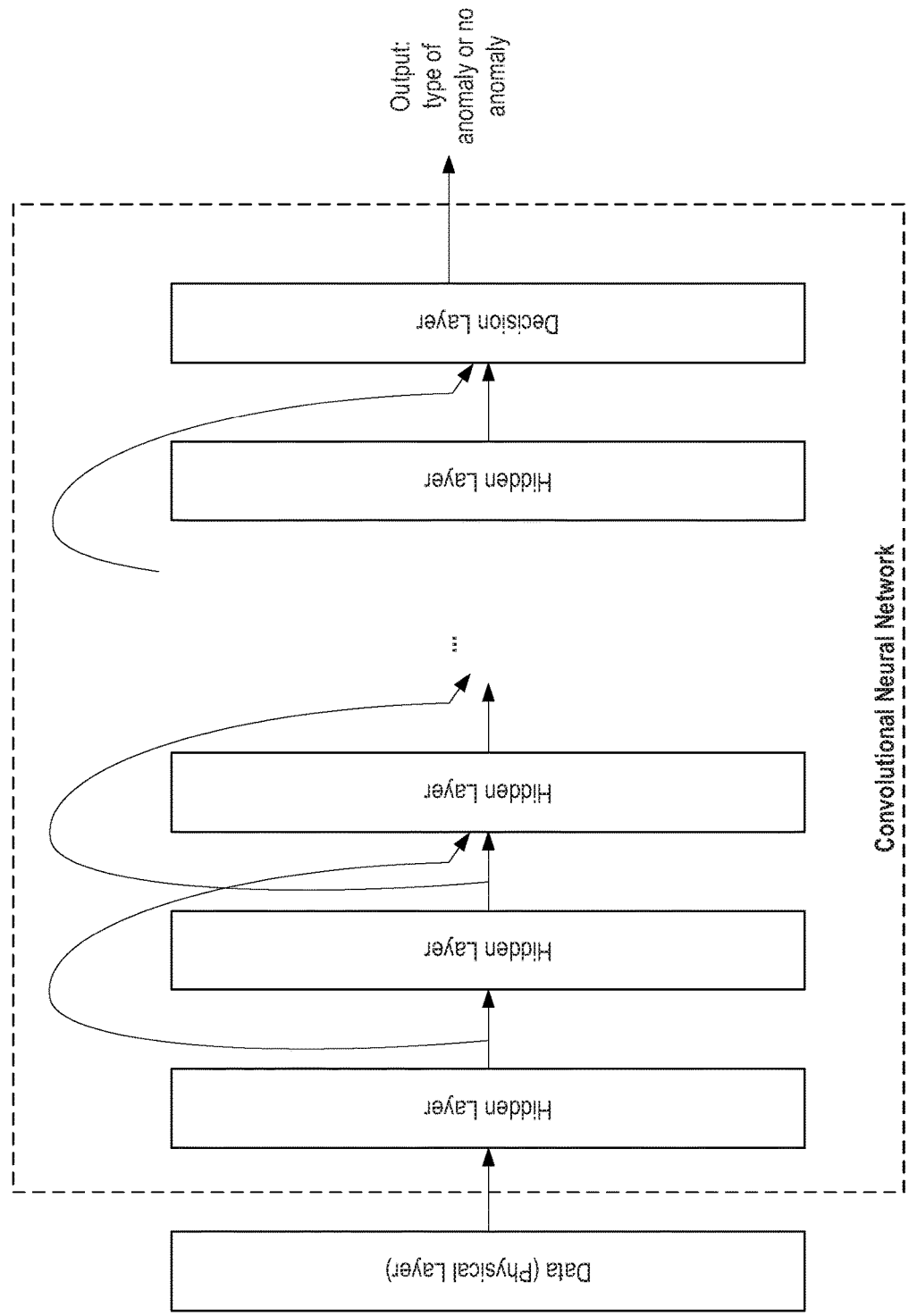
FIG. 1 illustrates an example convolutional neural network (CNN) that can be implemented in an anomaly detection framework, according to some embodiments.

FIG. 1 illustrates an example CNN that can be implemented in an anomaly detection framework, according to some embodiments. The arrows in the figure indicate information flow. The data is fed into the lowest layer (the "Data" or "Physical" Layer), which processes to extract some feature information. This information can be fed to any of the higher Hidden Layers or the Decision Layer. Likewise, any Hidden Layer can use the features extracted from the past layers to process and output its feature information. The Decision Layer can use the features extracted from any hidden layers to process and output the decision of whether there is an anomaly or not and the type of anomaly.

The CNN, with a good architectural design, can be well stabilized during training, and hence can be easily scaled up. Also, with a sufficient number of hidden layers, the CNN can extract complex and very useful features for the detection. As such, the CNN helps reducing (significantly) feature handcrafting. In fact, the raw data can be fed into any CNN, without data pre-processing. Moreover, the CNN attains very good performance with a sufficient number of hidden layers, since it can extract complex features. The more layers, the more complex features it extracts. The above enables the use of the CNN, which usually attains superior performance in supervised problems. This also takes more advantage of the big data regime.

Traditionally, CNNs are useful for image classification since it can extract the local information, such as an edge of an object, from the image. When it is applied to the time series or sequential data as it is in the TES, it is able to find the local information within a one time series, such as a peak, or interaction between multiple time series, such as a positive correlation between bidding prices and demands. As described in further detail below, the methods, systems, and apparatuses described herein adapt a CNN for anomaly detection in the context of TES. This adapted CNN is referred to herein as an "anomaly detection CNN."

The anomaly detection CNN has several hidden layers that extract useful features from the raw physical data, which are then fed to a final layer, placed at the end of the anomaly detection CNN, to distill detection information. The anomaly detection CNN takes as input the data (processed or raw) from the physical layer, and outputs a decision of whether there is an anomaly or not and, if there is an anomaly, the type of anomaly. Each hidden layer of the anomaly detection CNN can be in the form of convolutional layer, fully-connected layer, non-linearities, dropout layer, batch-normalization layer, or any combination of them in any order. The CNN has learnable parameters in those components. These parameters have to be learned during a training process, in which training data is entered with a pre-determined label which indicates whether it contains an anomaly or not (and the type of anomaly if such information is given). The parameters are self-adjusted so that the outcome of the CNN when the data is fed in is close to the data's ground truth.

Data from the physical layer is collected and labelled for the model training purpose. CNN is a supervised learning method where the training data are categorized into multiple groups and CNN finds the characteristics that can differentiate different groups and thus make predictions for the new data, while in a typical situation of anomaly detection, only one group of data are observed. In order to transform the task into a supervised way, two general scenarios may be considered during the training process. First, outliers in the normal data without attacks are quite common and those outliers are marked as anomalies in the training process when only the normal data are provided. The anomaly detection CNN is able to learn a set of generalized high level features, which can be used later to classify attacks even it is unseen in the training data. Secondly, if a database of attacks is recorded and provided, those attack data will be directly used in the training process. If attacks can be further grouped into subcategories, the anomaly detection CNN can also be trained to distinguish different types of attacks. Similarly, because of the ability of high level feature generalization, unseen attacks could also be observed after the training process.

After training, the anomaly detection CNN is ready for use. For unseen data unit coming in, the anomaly detection CNN decides whether it contains an anomaly (or what type of anomaly it is if such information is given in the training phase). The output results can also be incorporated into an existing security system which monitors the cyber layer data. The decision to raise an alarm can be decided by combining the suggestion from our model and the cyber security software.

Figure 2:
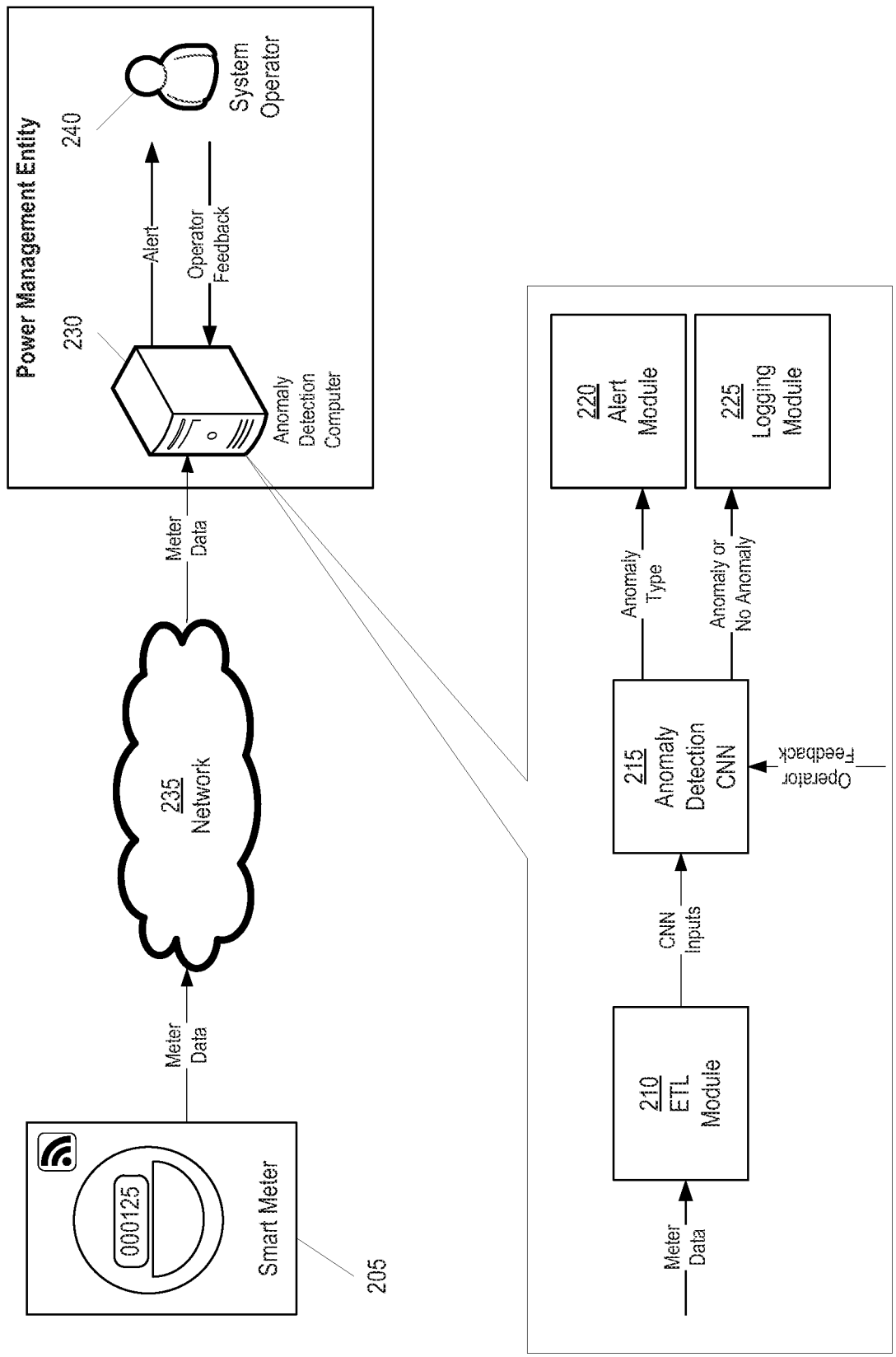
FIG. 2 shows an example implementation of an anomaly detection system, according to some embodiments of the present invention.
Figure 3:
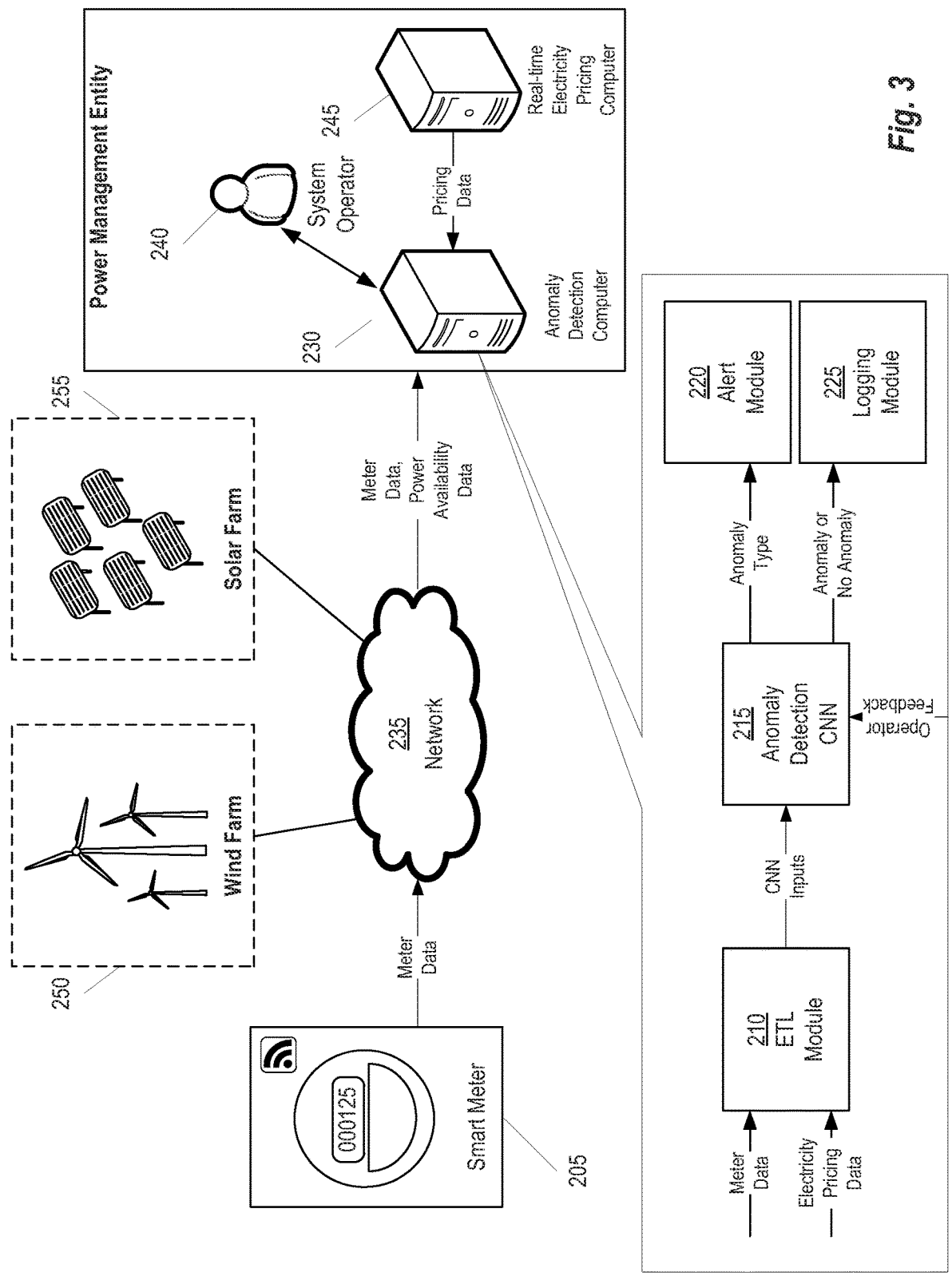
FIG. 3 shows another example of an anomaly detection monitoring system, according to other embodiments of the present invention.
Figure 4:
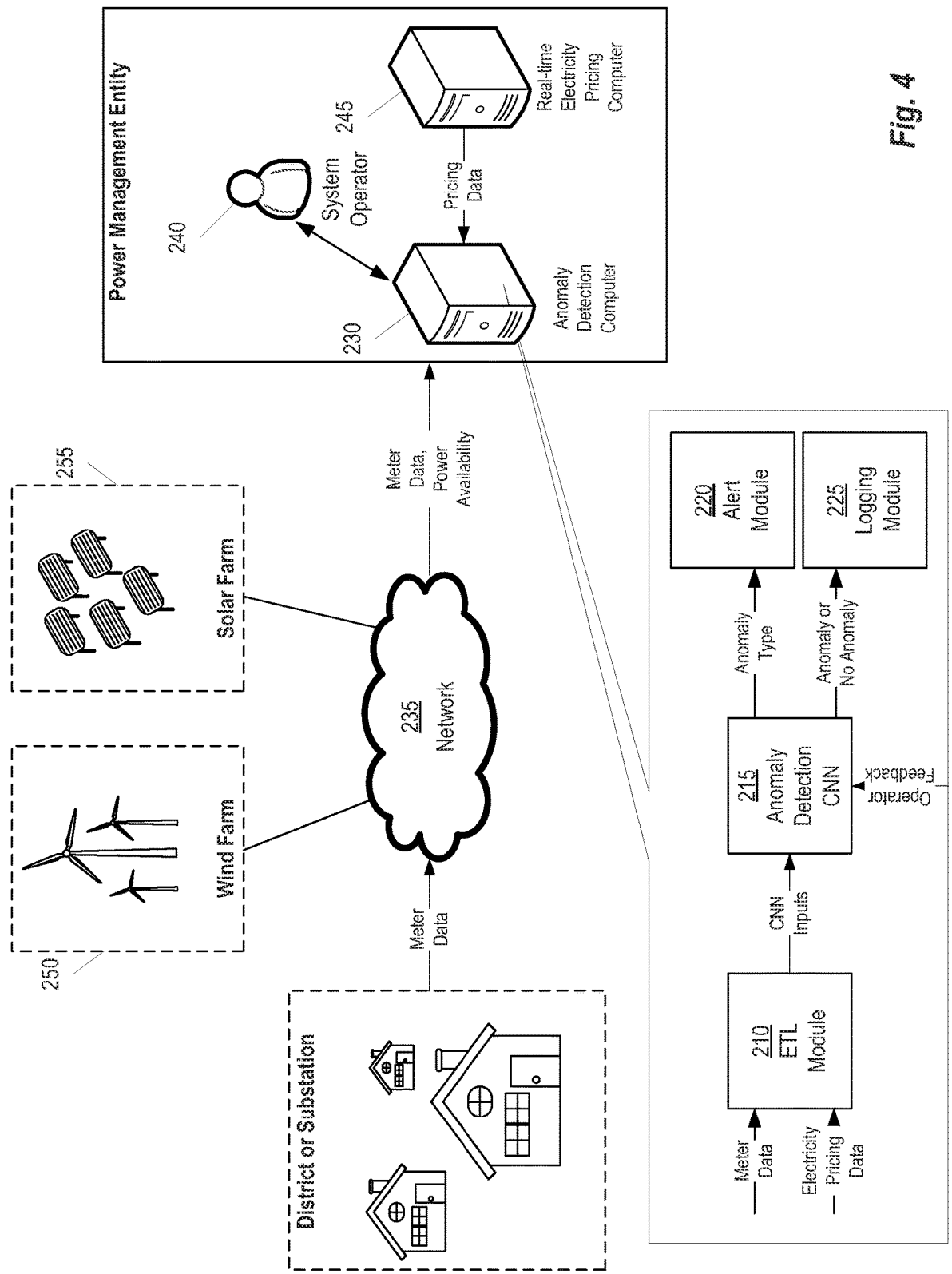
FIG. 4 shows an extension of the anomaly detection monitoring system shown in FIG. 3.

The anomaly detection framework described herein is flexible and may be implemented in a variety of ways. FIGS. 2-4 illustrate three example scenarios. However, it should be understood that the techniques described herein are readily adaptable to other power systems as well.

FIG. 2 shows an example implementation of an anomaly detection system, according to some embodiments of the present invention. A smart meter 205 is connected to an anomaly detection computer 230 via network 235 (e.g., the Internet). The smart meter 205 may be tasked with monitoring power consumption at, for example, a home or a commercial building. In the example of FIG. 2, the anomaly detection computer 230 is located at the entity that manages power for the structure associated with the smart meter 205; however, in general, the anomaly detection computer 230 cannot be located in a cloud-based environment or in any other computing environment accessible to the power management entity.

The measurements of power consumption (referred to herein as "meter data") are transmitted by the smart meter 205 to the anomaly detection computer 230 via the network 235. These transmissions may be made, for example, in real-time, at periodic intervals, upon request. The anomaly detection computer 230 processes the meter data with an extract, transform, and load (ETL) module 210 that extracts relevant information from the meter data, transforms that information into the proper structure to be used as inputs to the anomaly detection CNN 215, and executes the anomaly detection CNN 215 with the inputs. The ETL module 210 performs a function similar to the physical layer discussed above with reference to FIG. 1. The exact information extracted from the meter data will depend on the characteristics of data provided by the smart meter 205 and the configuration of the anomaly detection CNN 215. For example, in one embodiment, the meter data comprises time series data specifying power consumption values for a plurality of time values. The anomaly detection CNN 215 may be trained to accept as input a matrix comprising the consumption values and the time values. Thus, the ETL module 210 would extract the values from the received meter, as necessary, and format them into the matrix before executing the anomaly detection CNN 215.

The anomaly detection computer 230 determines whether the meter data indicates the occurrence of an anomaly. If an anomaly is detected, an alert module 220 is used to generate an alert for a system operator 240. This alert can take the form of, for example, a message sent to a device (e.g., text message, email, etc.) or a message presented on a system display within the power management entity's facility. In this way, the system operator 240 can react to the anomaly accordingly. In the example of FIG. 2, the anomaly detection CNN 215 is trained to generate the type of anomaly and this information is also communicated to the system operator 240 via the alert module 220. In embodiments where the anomaly detection CNN 215 is not trained to determine anomaly type, the system operator 240 may simply receive a message that an anomaly occurred.

In response, system operator 240 provides a feedback to the alert message received from the anomaly detection computer 230. This feedback can take the form of, for example, a message specifying that the alert should be ignored. The system operator 240 may also specify the reason for ignoring the alert (e.g., it is not a true anomaly, the anomaly was expected, etc.). In the anomaly detection CNN 215 receives this feedback and uses it to retrain the CNN. Such retraining can be performed as the feedback is received or at periodic intervals (e.g., during off-hours). In this way, the anomaly detection CNN 215 can adapt over time based on real-world data.

In the example of FIG. 2, a logging module 225 is also included to capture the output of the data from the anomaly detection CNN 215 as it is generated. Any additional information relevant to the meter data may likewise be logged. For example, in some embodiments, the anomaly detection CNN 215 also generates a probability value indicating the probability of an anomaly associated with the meter data. A threshold is applied to these probability values to provide a binary value indicating either the occurrence or non-occurrence of an anomaly. However, it would be informative for the logging module 225 to record the probability values so that they can be used for later verification, validation, and possible adjustment of the parameters of the anomaly detection CNN 215.

Adding more data sources to the model can be simply achieved by increasing the number of channels when designing the CNN model. One advantage of deep CNN is that it can construct the useful features while training the model without knowing the exact logic between different data sources. Therefore, even for different model scenarios, it is efficient and flexible to implement an anomaly detection system described herein without fine crafted features from a domain expert for a particular physical model or configuration.

FIG. 3 shows another example of an anomaly detection monitoring system, according to other embodiments of the present invention. In this example, common information shared by all power system components, such as the price information, is monitored in addition to the information from the smart meter 205. In this example, there are two power generation sources 250, 255 that generate power and notify the power management entity about the availability of data. In this example, the power management entity has a real-time electricity pricing computer 245 that collects the information from the power generation sources 250, 255 (and other power sources), and determines how electricity should be priced for consumers. In addition to information about power availability, the real-time electricity pricing computer 245 may also collect other information relevant to electricity pricing (e.g., weather condition, predicted high consumption events, etc.). The real-time electricity pricing computer 245 uses models or other techniques to predict demand and generate pricing data.

The anomaly detection computer 230 uses the pricing data from the real-time electricity pricing computer 245 as an additional input to the anomaly detection CNN 215. The ETL module 210 in this embodiment has additional functionality that allows the extraction, transformation, and loading of the electricity pricing data as it is received. For example, in some embodiments, the input to the anomaly detection CNN 215 is a matrix of values. One or more rows of this matrix store time-series meter data for the smart meter 205. One or more other rows of the matrix have the electricity pricing data. In each case, the columns of the matrix represent individual time-series value. Aside from meter data and electricity pricing data, the matrix may store additional information collected by the anomaly detection computer 230. For example, in some embodiments, the matrix may include data from demand response resources, other local generation sources, storage devices, grid monitoring and control devices, and microgrids. Time series data for each data source may be stored as a separate row in the input matrix; thus allowing the anomaly detection CNN 215 to utilize additional information when detecting anomalies.

FIG. 4 shows an extension of the anomaly detection monitoring system shown in FIG. 3. This example illustrates how a more complicated model can be built based on a neighborhood of a component in the TES network. In this example, the smart meter for a house is monitored together with other houses in the same district or the substation in which the house is located. Thus, the matrix used as input to the anomaly detection CNN 215 would include time series meter data for each house in the district or the substation, along with the data discussed above with reference to FIG. 3.

Figure 5:
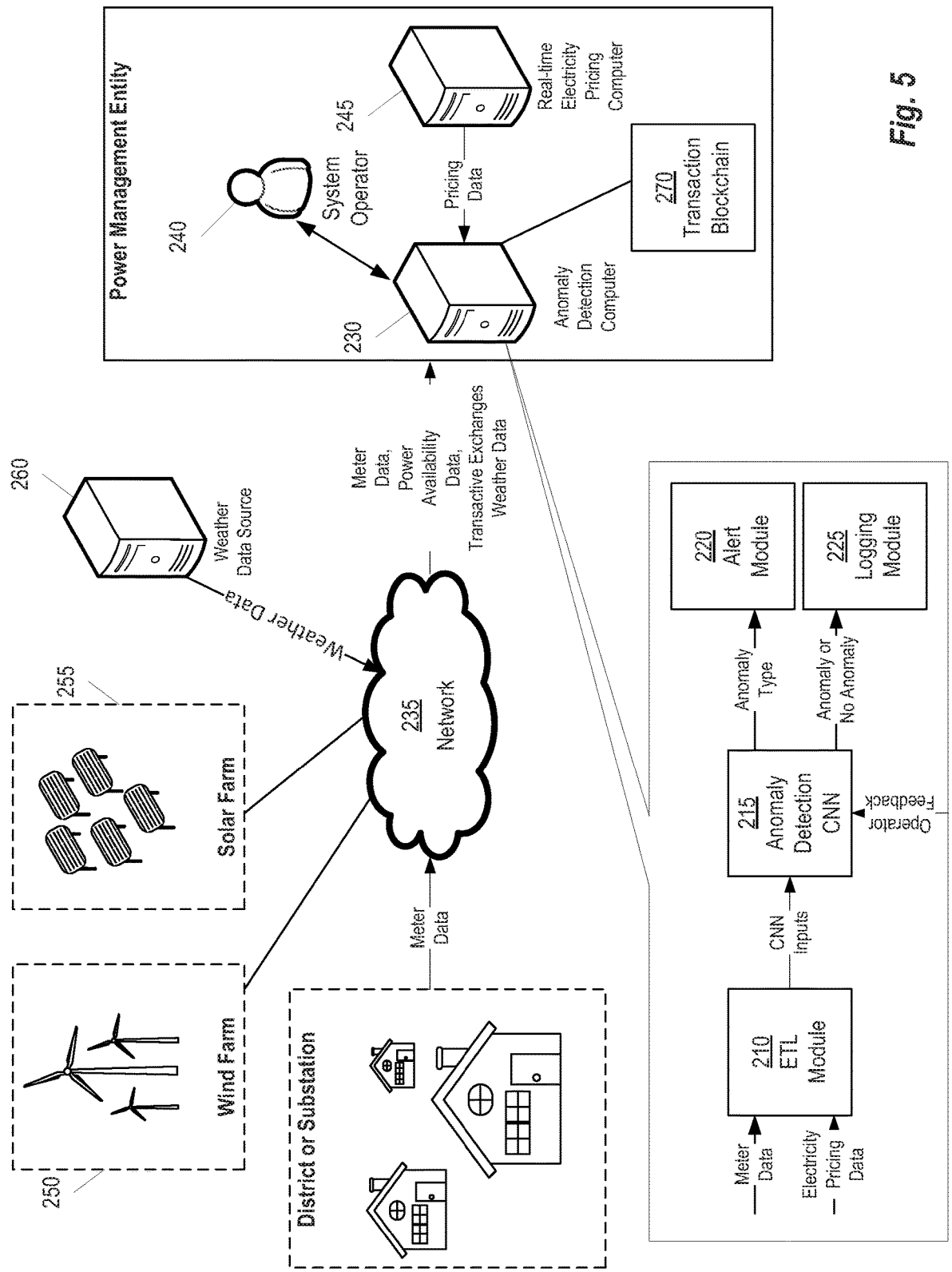
FIG. 5 shows another extension of the anomaly detection monitoring system shown in FIG. 3.

FIG. 5 shows another extension of the anomaly detection monitoring system shown in FIG. 3. Here, in addition to the consumer and producer data source discussed above, there are two additional sources of data that are used as input to the anomaly detection CNN 215. First, a weather data source 260 provides weather data corresponding to the location(s) of the consumers and/or the location(s) of the producers. This weather data source may be, for example, a web server operated by the National Weather Service (NWS). The second source of data used to anomaly detection is transactive data describing purchases of data between consumers, between producers, or between producers and consumers. In the example of FIG. 5, the anomaly detection computer maintains a Blockchain ledger 270 that records transactions involving power generation or use. These transactions may be between producers, between consumers, or between producers and consumers. As new blocks (i.e., transactions) are recorded in the ledger, the data used for anomaly detection can be updated accordingly.

Figure 6:
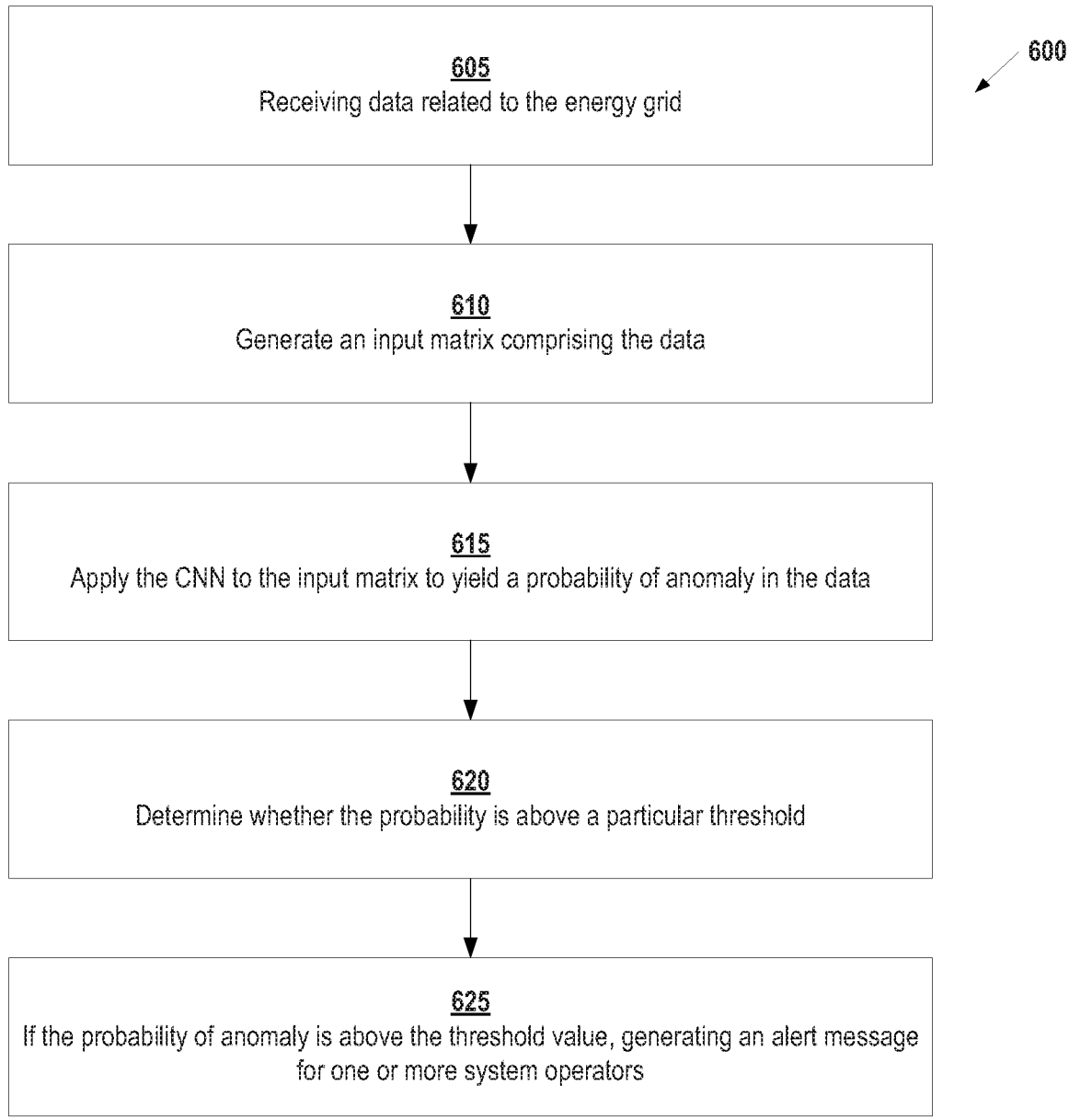
FIG. 6 provides a flowchart showing a method for using a CNN to detect anomalies in an electric grid data, according to some embodiments.

FIG. 6 provides a flowchart showing a method 600 for using a CNN to detect anomalies in electric grid data, according to some embodiments. Starting at step 605, the anomaly detection computer receives data related to the electric grid. As used herein, the term "received" is intended to include any technique for obtaining the data. For example, "receiving" may entail the anomaly detection computer retrieving or otherwise collecting the data from one or more data sources or "receiving" may entail the anomaly detection computer receiving data transmitted by the source without an explicit request being sent to the data source.

In general, the data received at step 605 may include any time series data related to the electric grid. For example, in some embodiments, this data includes electricity demand data comprising time series measurements of consumption of electricity by a plurality of consumers. Similarly, the data may include electricity supply data comprising time series measurements of availability of electricity by one or more producers. In one embodiment, the electricity demand data is meter data collected from one or more smart meters corresponding to the consumers. In some embodiments, the consumers may be located in a particular substation or in a plurality of different substations. In other embodiments, the consumers each located within a microgrid with at least one of the producers.

In some embodiments, the data received at step 605 includes time series records of transactive exchanges for energy purchases. Additional examples of data that may be received at step 605 include, without limitation, time series pricing data corresponding to pricing of electricity from the one or more producers and weather data indicating weather conditions at locations corresponding to the producers and/or the consumers.

At step 610, the anomaly detection computer generates an input matrix comprising the data received at step 605. In general, any technique may be used for combining and formatting the data into the matrix. For example, where all of the data provides data values at the same time values, the matrix may be generated by creating a matrix with each row corresponding data from a particular source. In embodiments, where the data is provided at different time values for different sources the data may be interpolated to fill in missing data prior to forming the matrix. The rows of the matrix could be arranged randomly or based on the order of receipt by the anomaly detection computer. Alternatively, the anomaly detection computer may use different techniques for arranging the data in a way that optimizes use of the CNN. For example, data could be grouped based on the type of data (e.g., data related to producers, data related to consumers, etc.) or the data could be ordered such that higher fidelity data is located at a particular location of the matrix (e.g., the center row).

Continuing with reference to FIG. 6, at step 615, the anomaly detection computer applies the CNN to the input matrix to yield a probability of anomaly in the data. The anomaly should be interpreted in the context of the data used at input to the CNN. For example, if the data received at step 605 is electricity demand data and electricity supply data, probability of an anomaly generated at step 615 will correspond to the electricity demand data and the electricity supply data. In some embodiments, the CNN also generates a type of anomaly which provides further detail on the anomaly. To continue with the previous example, if the input data is electricity demand data and electricity supply data, the type of anomaly may indicate that an anomaly has occurred with respect to demand data. The type of anomaly may also include further detail (e.g., reduced production by a particular producer).

At step 620, the anomaly detection computer determines whether the probability is above a particular threshold. This threshold may be based on the desired sensitivity of the overall anomaly detection system. That is, a low threshold may be set to identify more events as being anomalous, while a high threshold would identify fewer events as anomalous. The threshold may be set, for example, by the system operator or another individual tasked with maintaining the anomaly detection system. Alternatively, in some embodiments, the anomaly detection system automatically adjusts the threshold over time. For example, if the system operator provides feedback indicating that a large number of false positives are being identified, the anomaly detection system may be increased. In some embodiments, the size of the increase may be based on the number of false positives identified in the feedback (e.g., for 6 false positives increase the threshold by 1%, for 10 false positives increase the threshold by 2%, etc.).

At step 625, if the probability of an anomaly is above the threshold value, an alert message is generated for one or more system operators. As noted above, this alert message may generally take any form including without limitation, an email message, a text message, or a message displayed on a desktop computer or other computer system used by the system operator. In some embodiments, one or more feedback messages from the system operators are received in response to the alert message. The CNN may then be retrained based on this feedback. For example, if the system operator indicates that a particular event is not anomalous, the CNN may label the data accordingly and use it in its training set.

Figure 7:
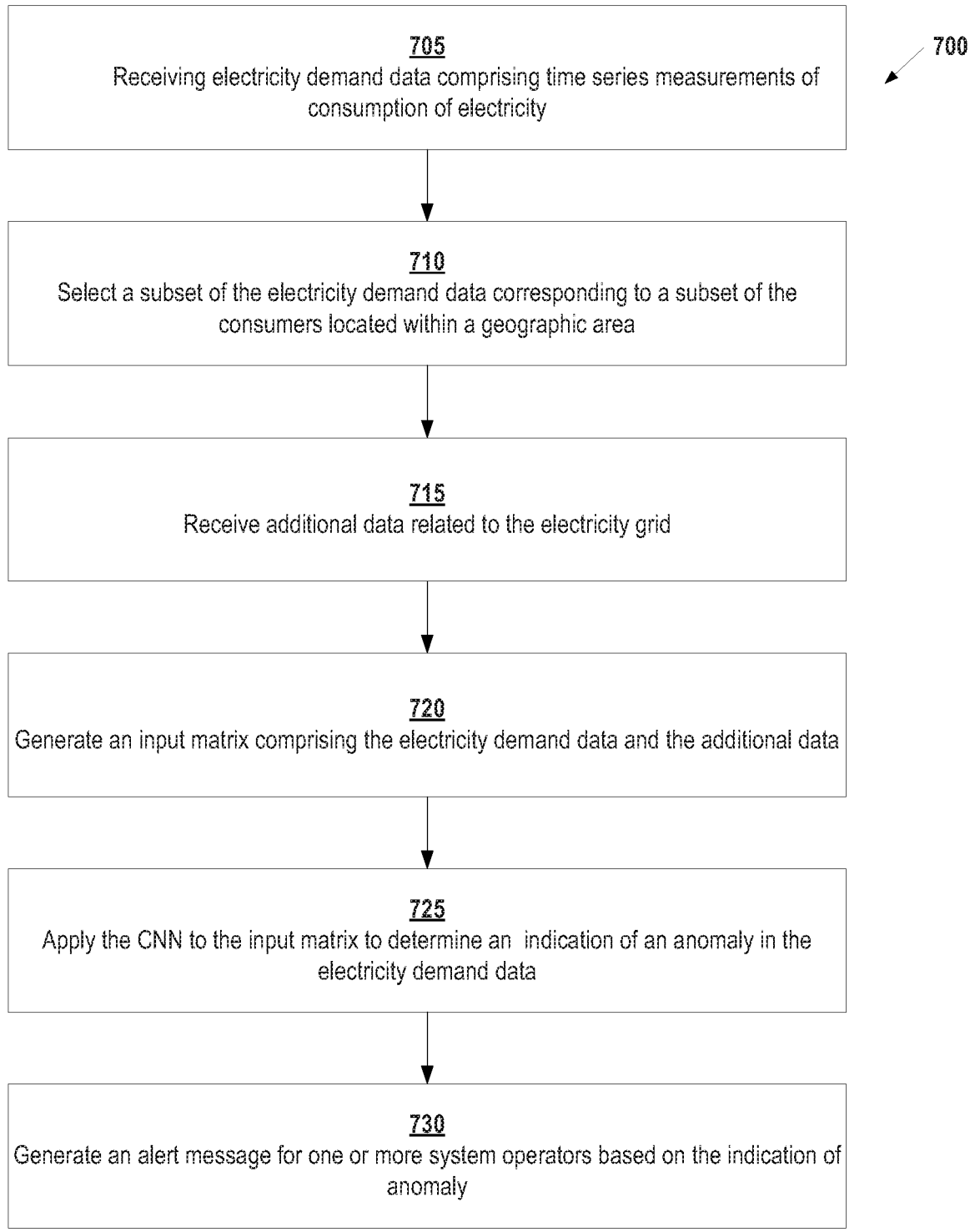
FIG. 7 illustrates an alternative method for using a CNN to detect anomalies.

FIG. 7 illustrates an alternative method 700 for using a CNN to detect anomalies. Starting at step 705, the anomaly detection computer receives electricity demand data comprising time series measurements of consumption of electricity by a plurality of consumers. These consumers may be located across a number of substations, microgrids, etc. At step 710, the anomaly detection computer selects a subset of the electricity demand data corresponding to a subset of the consumers located within a geographic area. This geographic area may be selected to include, for example, a particular set of substations. The section may be made by the system operator or automatically by the system. For example, in some embodiments, the anomaly detection system automatically divides all of its consumers into geographic areas and monitors each area independently.

Continuing with reference to FIG. 7, at step 715, the anomaly detection computer receives pricing data indicating price of power for delivery to the geographical area at times corresponding to the time series measurements of the electricity demand data. The anomaly detection computer may also collect additional data related to the energy grid at step 715. For example, in one embodiment, the anomaly detection computer receives time series records of transactive exchanges between the producers and the consumers for energy purchases via a monitored Blockchain ledger. At step 720, the anomaly detection computer generate an input matrix comprising the subset of electricity demand data and the pricing data and, at step 725, the CNN is applied to the input matrix to yield an indication of an anomaly in the electricity demand data. Finally, at step 730, the anomaly detection computer generates an alert message for one or more system operators based on the indication of an anomaly.

Figure 8:
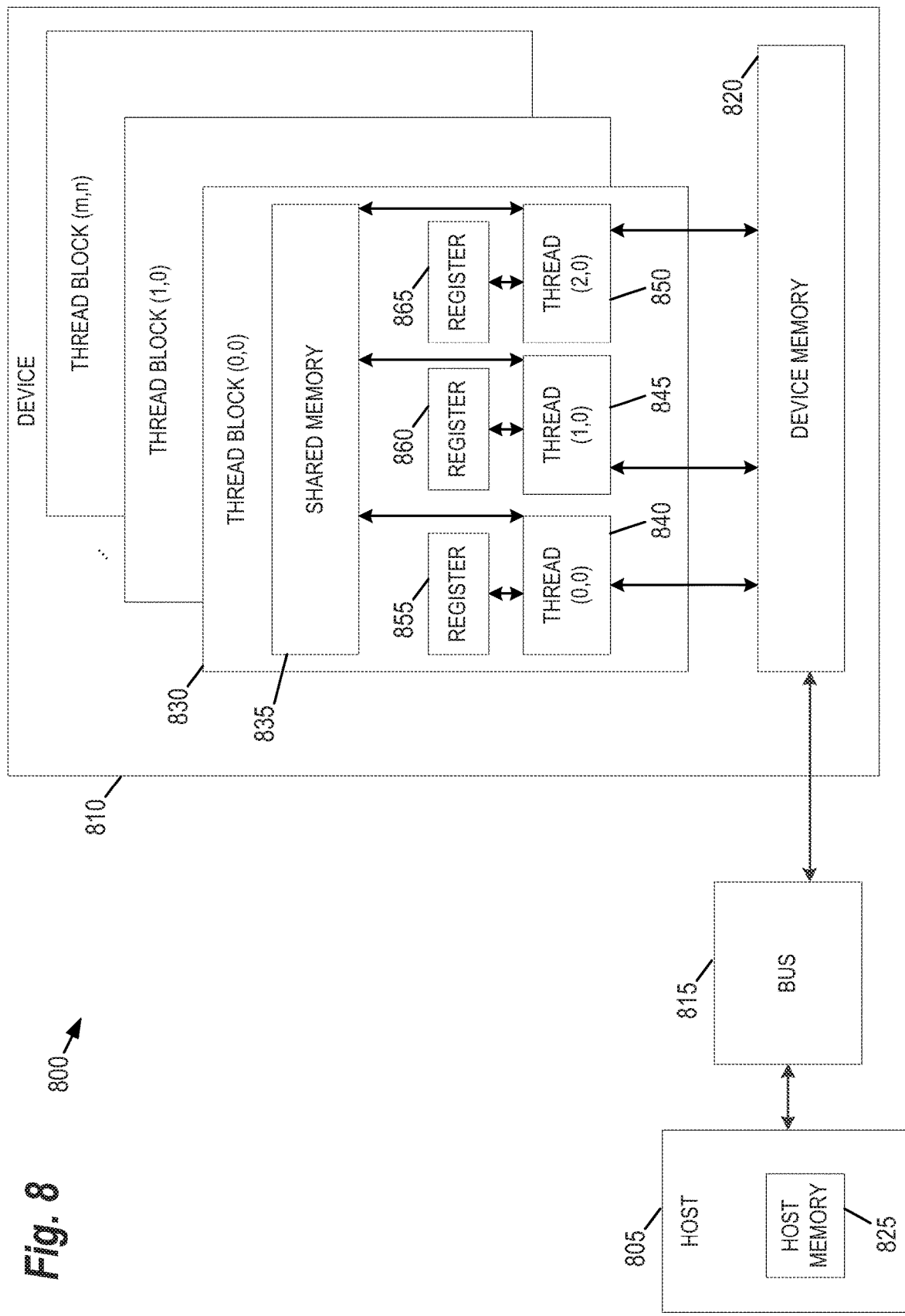
FIG. 8 provides an example of a parallel processing memory architecture that may be utilized in some embodiments of the present invention.

FIG. 8 provides an example of a parallel processing platform 800 that may be utilized in some embodiments of the present invention. For example, this platform 800 may be used for the anomaly detection CNN discussed above. This platform 800 may be used in embodiments of the present invention where NVIDIA™ CUDA (or a similar parallel computing platform) is used. The platform includes a host computing unit ("host") 805 and a GPU device ("device") 810 connected via a bus 815 (e.g., a PCIe bus). The host 805 includes the central processing unit, or "CPU" (not shown in FIG. 8) and host memory 825 accessible to the CPU. The device 810 includes the graphics processing unit (GPU) and its associated memory 820, referred to herein as device memory. The device memory 820 may include various types of memory, each optimized for different memory usages. For example, in some embodiments, the device memory includes global memory, constant memory, and texture memory.

Parallel portions of a deep learning application may be executed on the platform 800 as "device kernels" or simply "kernels." A kernel comprises parameterized code configured to perform a particular function. The parallel computing platform is configured to execute these kernels in an optimal manner across the platform 800 based on parameters, settings, and other selections provided by the user. Additionally, in some embodiments, the parallel computing platform may include additional functionality to allow for automatic processing of kernels in an optimal manner with minimal input provided by the user.

The processing required for each kernel is performed by grid of thread blocks (described in greater detail below). Using concurrent kernel execution, streams, and synchronization with lightweight events, the platform 800 of FIG. 8 (or similar platforms) may be used to parallelize training of a deep neural network. For example, in some embodiments, a separate kernel is dedicated to each time step of data in the input matrix.

The device 810 includes one or more thread blocks 830 which represent the computation unit of the device 810. The term thread block refers to a group of threads that can cooperate via shared memory and synchronize their execution to coordinate memory accesses. For example, in FIG. 8, threads 840, 845 and 850 operate in thread block 830 and access shared memory 835. Depending on the parallel computing platform used, thread blocks may be organized in a grid structure. A computation or series of computations may then be mapped onto this grid. For example, in embodiments utilizing CUDA, computations may be mapped on one-, two-, or three-dimensional grids. Each grid contains multiple thread blocks, and each thread block contains multiple threads. For example, in FIG. 8, the thread blocks 830 are organized in a two dimensional grid structure with m+1 rows and n+1 columns. Generally, threads in different thread blocks of the same grid cannot communicate or synchronize with each other. However, thread blocks in the same grid can run on the same multiprocessor within the GPU at the same time. The number of threads in each thread block may be limited by hardware or software constraints. In some embodiments, the individual thread blocks can be selected and configured to optimize training of the deep learning network. For example, in one embodiment, each thread block is assigned a subset of training data with overlapping values. In other embodiments, thread blocks can be dedicated to different types of input data in the matrix or data from different substations or microgrids.

Continuing with reference to FIG. 8, registers 855, 860, and 865 represent the fast memory available to thread block 830. Each register is only accessible by a single thread. Thus, for example, register 855 may only be accessed by thread 840. Conversely, shared memory is allocated per thread block, so all threads in the block have access to the same shared memory. Thus, shared memory 835 is designed to be accessed, in parallel, by each thread 840, 845, and 850 in thread block 830. Threads can access data in shared memory 835 loaded from device memory 820 by other threads within the same thread block (e.g., thread block 830). The device memory 820 is accessed by all blocks of the grid and may be implemented using, for example, Dynamic Random-Access Memory (DRAM).

Each thread can have one or more levels of memory access. For example, in the platform 800 of FIG. 8, each thread may have three levels of memory access. First, each thread 840, 845, 850, can read and write to its corresponding registers 855, 860, and 865. Registers provide the fastest memory access to threads because there are no synchronization issues and the register is generally located close to a multiprocessor executing the thread. Second, each thread 840, 845, 850 in thread block 830, may read and write data to the shared memory 835 corresponding to that block 830. Generally, the time required for a thread to access shared memory exceeds that of register access due to the need to synchronize access among all the threads in the thread block. However, like the registers in the thread block, the shared memory is typically located close to the multiprocessor executing the threads. The third level of memory access allows all threads on the device 810 to read and/or write to the device memory. Device memory requires the longest time to access because access must be synchronized across the thread blocks operating on the device. Thus, in some embodiments, processing the input matrix is coded such that it primarily utilizes registers and shared memory and only utilizes device memory as necessary to move data in and out of a thread block.

The embodiments of the present disclosure may be implemented with any combination of hardware and software. For example, aside from parallel processing platform presented in FIG. 8, standard computing platforms (e.g., servers, desktop computer, etc.) may be specially configured to perform the techniques discussed herein. In addition, the embodiments of the present disclosure may be included in an article of manufacture (e.g., one or more computer program products) having, for example, computer-readable, non-transitory media. The media may have embodied therein computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112(f) unless the element is expressly recited using the phrase "means for."

We claim:

1. A computer-implemented method for power grid anomaly detection using a convolutional neural network (CNN) trained to detect anomalies in electricity demand data and electricity supply data, the method comprising:
   receiving electricity demand data comprising time series measurements of consumption of electricity by a plurality of consumers;
   receiving electricity supply data comprising time series measurements of availability of electricity by one or more producers;
   generating an input matrix comprising the electricity demand data and the electricity supply data;
   applying the CNN to the input matrix to yield a probability of anomaly in the electricity demand data and the electricity supply data; and
   if the probability of anomaly is above a threshold value, generating an alert message for one or more system operators.

2. The method of claim 1, further comprising:
   receiving time series records of transactive exchanges between the producers and the consumers for energy purchases,
   wherein the input matrix to the CNN further comprises the time series records of transactive exchanges between the producers and the consumers for energy purchases.

3. The method of claim 1, further comprising:
   receiving time series pricing data corresponding to pricing of electricity from the one or more producers,
   wherein the input matrix to the CNN further comprises the time series pricing data.

4. The method of claim 1, further comprising:
   receiving weather data indicating weather conditions at locations corresponding to the one or more producers,
   wherein the input matrix to the CNN further comprises the weather data.

5. The method of claim 1, further comprising:
   receiving weather data indicating weather conditions at locations corresponding to the one or more consumers,
   wherein the input matrix to the CNN further comprises the weather data.

6. The method of claim 1, wherein the consumers are all located in a particular substation.

7. The method of claim 1, wherein the consumers each located within a microgrid with at least one of the producers.

8. The method of claim 1, wherein the plurality of consumers are located in a plurality of substations.

9. The method of claim 1, further comprising:
   in response to the alert message, receiving one or more feedback messages from the one or more system operators; and
   retraining the CNN based on the one or more feedback messages.

10. The method of claim 1, wherein receiving the electricity demand data comprises collecting meter data from one or more smart meters corresponding to the consumers.

11. The method of claim 1, wherein the CNN further outputs an anomaly type in addition to the probability of anomaly and the alert message comprises the anomaly type.

12. A computer-implemented method for power grid anomaly detection using a convolutional neural network (CNN) trained to detect anomalies in electricity demand data, the method comprising:
 receiving electricity demand data comprising time series measurements of consumption of electricity by a plurality of consumers;
 selecting a subset of the electricity demand data corresponding to a subset of the consumers located within a geographic area;
 receiving pricing data indicating price of power for delivery to the geographical area at times corresponding to the time series measurements of the electricity demand data;
 generating an input matrix comprising the subset of electricity demand data and the pricing data;
 applying the CNN to the input matrix to yield an indication of an anomaly in the electricity demand data; and
 generating an alert message for one or more system operators based on the indication of anomaly.

13. The method of claim 12, further comprising:
 receiving time series records of transactive exchanges between the producers and the consumers for energy purchases,
 wherein the input matrix to the CNN further comprises the time series records of transactive exchanges between the producers and the consumers for energy purchases.

14. The method of claim 12, further comprising:
 receiving time series records of power availability within the geographic area,
 wherein the input matrix to the CNN further comprises the time series records of power availability.

15. The method of claim 12, further comprising:
 receiving weather data indicating weather conditions at locations corresponding to the geographic area,
 wherein the input matrix to the CNN further comprises the weather data.

16. The method of claim 12, wherein the geographic area is selected to span a plurality of substations.

17. The method of claim 12, further comprising:
 in response to the alert message, receiving one or more feedback messages from the one or more system operators; and
 retraining the CNN based on the one or more feedback message.

18. The method of claim 12, wherein receiving the electricity demand data comprises collecting meter data from one or more smart meters corresponding to the consumers.

19. The method of claim 12, wherein the CNN further outputs an anomaly type in addition to the probability of anomaly and the alert message comprises the anomaly type.

20. A system for using detecting convolutional neural network (CNN) trained to detect anomalies in electricity demand data, the system comprising:
 a plurality of smart meters collecting electricity demand data comprising time series measurements of consumption of electricity by a plurality of consumers;
 a parallel processing platform comprising a:
  a host computer configured to (i) receive electricity supply data comprising time series measurements related to the availability of electricity by one or more producers, (ii) and generate an input matrix comprising the electricity demand data and the electricity supply data;
  a device computer comprising a plurality of processors configured applying the CNN to the input matrix to yield a probability of anomaly in the electricity demand data and the electricity supply data.

* * * * *